United States Patent
Bae et al.

(10) Patent No.: US 7,613,539 B2
(45) Date of Patent: Nov. 3, 2009

(54) SYSTEM AND METHOD FOR MESH AND BODY HYBRID MODELING USING 3D SCAN DATA

(75) Inventors: Seockhoon Bae, Cupertino, CA (US); Donghoon Lee, Seoul (KR); Doosoo Kim, Seoul (KR); Youngkwan Kim, Seoul (KR); Sungwook Cho, Bucheon (KR)

(73) Assignee: INUS Technology, Inc., Seoul (KR)

( * ) Notice: Subject to any disclaimer, the term of this patent is extended or adjusted under 35 U.S.C. 154(b) by 201 days.

(21) Appl. No.: 11/683,163

(22) Filed: Mar. 7, 2007

(65) Prior Publication Data

US 2007/0265727 A1 Nov. 15, 2007

Related U.S. Application Data

(60) Provisional application No. 60/767,516, filed on May 9, 2006.

(51) Int. Cl.
*G06F 19/00* (2006.01)
*G06F 17/50* (2006.01)

(52) U.S. Cl. .......................................... 700/182; 703/2

(58) Field of Classification Search .................. 700/97, 700/98, 118–120, 163, 182; 703/1, 2; 706/919; 715/964; 716/20
See application file for complete search history.

(56) References Cited

U.S. PATENT DOCUMENTS

| | | | | |
|---|---|---|---|---|
| 6,073,056 A | * | 6/2000 | Gawronski et al. ............ | 700/98 |
| 6,099,573 A | * | 8/2000 | Xavier ............................. | 703/7 |
| 7,215,430 B2 | * | 5/2007 | Kacyra et al. ................ | 356/601 |
| 2002/0059042 A1 | * | 5/2002 | Kacyra et al. ................ | 702/152 |
| 2002/0145607 A1 | * | 10/2002 | Dimsdale ..................... | 345/423 |
| 2005/0134586 A1 | | 6/2005 | Koo et al. | |
| 2006/0069527 A1 | * | 3/2006 | Numata et al. .............. | 702/168 |
| 2007/0050073 A1 | * | 3/2007 | Unal et al. ................... | 700/118 |
| 2007/0065002 A1 | * | 3/2007 | Marzell et al. .............. | 382/154 |
| 2007/0088531 A1 | * | 4/2007 | Yuan ............................. | 703/2 |
| 2007/0124107 A1 | * | 5/2007 | Numata et al. .............. | 702/168 |
| 2008/0012851 A1 | * | 1/2008 | Bae et al. ..................... | 345/419 |
| 2008/0036755 A1 | * | 2/2008 | Bae et al. ..................... | 345/418 |
| 2008/0040080 A1 | * | 2/2008 | Bae et al. ....................... | 703/1 |

FOREIGN PATENT DOCUMENTS

JP 2003-242186 8/2003

* cited by examiner

*Primary Examiner*—M. N. Von Buhr
(74) *Attorney, Agent, or Firm*—Lahive & Cockfield, LLP; John S. Curran

(57) ABSTRACT

A mechanism for enabling a user to treat 3D scan data model regions as surface bodies so as to eliminate the need to convert model regions to parametric surfaces as a prerequisite to performing part body modeling operations is discussed. During CAD re-modeling raw 3D scan data is imported. The present invention allows a user to use a region directly as an input argument for a part body modeling operation as long as a sheet body (surface body) is applicable as a modeling input argument. Additionally, if any regions used in the body modeling are modified by the user, surfaces which have been generated from fitting regions are also recalculated and the body model is updated automatically. The region modification can happen when the user includes more scan data in the region, excludes scan data from the region, smoothes geometry, or uses other editing functions.

33 Claims, 20 Drawing Sheets

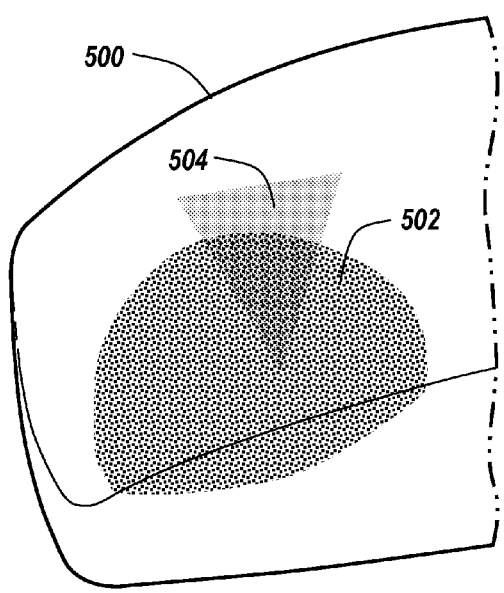 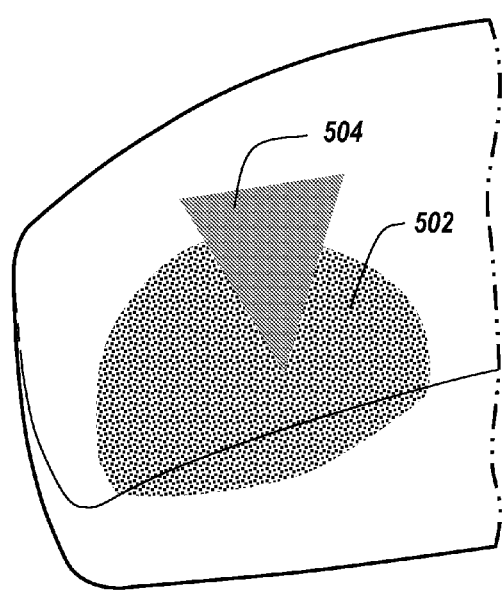
*Fig. 5A*  *Fig. 5B*

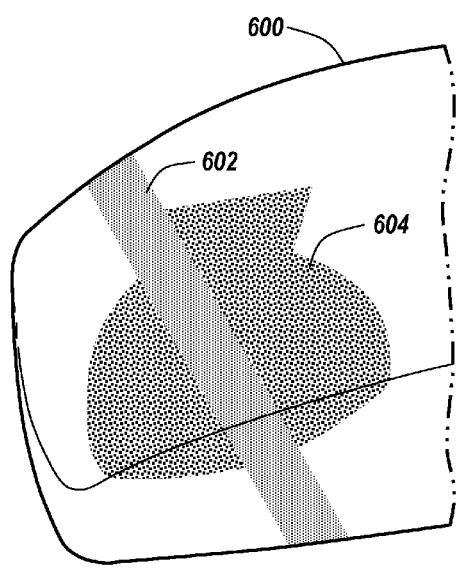 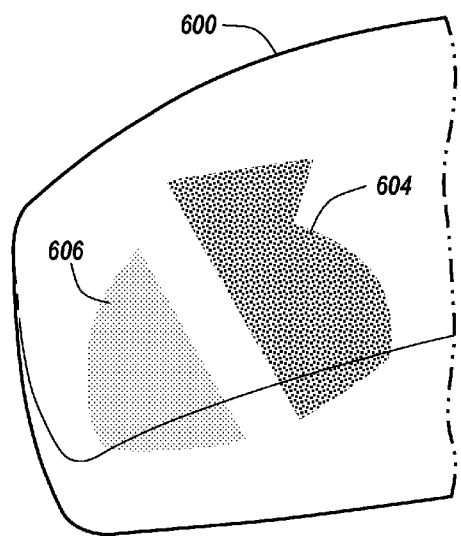
*Fig. 6A*  *Fig. 6B*

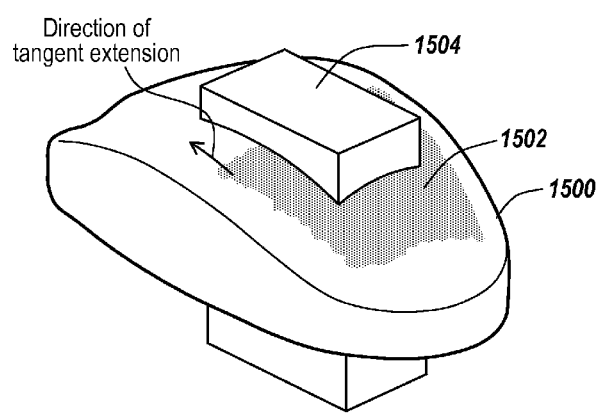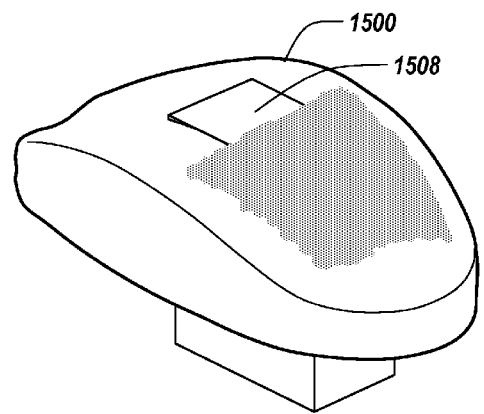
Fig. 15A                    Fig. 15B

SYSTEM AND METHOD FOR MESH AND BODY HYBRID MODELING USING 3D SCAN DATA

RELATED APPLICATION

This application claims the benefit of a United States Provisional Application entitled, "System and Method for Mesh and Body Hybrid Modeling Using 3D Scan Data", application No. 60/767,516, filed May 9, 2006.

FIELD OF THE INVENTION

The embodiments of the present invention relate generally to CAD (Computer Aided Design) and more particularly to the direct use of 3D scan data in a CAD part body modeling operation.

BACKGROUND

Computer Aided Design (CAD) applications are used to produce computer models of two and three dimensional objects as part of a production process for a physical device that is being modeled. The models frequently include multiple part bodies which must be individually designed. A part body is a computational model used by a CAD application to hold a solid or a sheet (open body with zero thickness) geometry. Once the designer is satisfied with the design, an actual physical device may be produced using the CAD model.

3D scanning captures physical geometry information for a three-dimensional object by gathering high resolution points representing the shape of the scanned three-dimensional object. The 3D scan data can be represented by either a set of points or dense triangular (or other shaped) meshes which cumulatively form a model of the scanned object. The model can be segmented into multiple groups referred to as regions. In a mesh model, the region is a mesh region that is a set of triangular facets which can be arbitrarily defined by the user or can be automatically identified by a computer program. The computer program can also be designed to detect and group planar, cylindrical, spherical, conical, toroidal, or free-form mesh regions by estimating and tracing the curvature information. Once captured, the raw 3D scan data may be converted to a CAD part model for further processing to replicate or modify the design of the three-dimensional object. This procedure of capturing 3D scan data for a three-dimensional object in order to provide it to a CAD application so that the object may be replicated or redesigned is referred as reverse engineering.

Remodeling a 3D CAD part body using 3D scan data requires time-consuming tasks. One of the complexities comes from the fact that a part body can only be operated on by other part bodies. For instance, a user can use a Boolean operation to merge two part bodies but conventionally there is no way to merge a CAD part body and a 3D scan data model. The user is forced to design a CAD solid or sheet bodies which replicate a scan data region as an intermediate step before the user can proceed to further regular CAD modeling procedures.

BRIEF SUMMARY

Embodiments of the present invention provide a computerized process working with a CAD system that allows a user to use point cloud models or mesh models created from raw scan data for CAD part body operations without requiring a preliminary conversion of the scan data into a CAD part body. The computerized process enables a user to treat model regions as surface bodies so as to eliminate the need to convert model regions to parametric surfaces as a prerequisite to performing CAD part body modeling operations. During CAD re-modeling raw 3D scan data that forms a model is imported. The present invention allows a user to use a model region directly as an input argument for a part body modeling operation as long as a sheet body (surface body) is applicable as a modeling input argument. Embodiments of the present invention also allow a user to cut a body by a region prior to carrying out the same procedures. Additionally, if any regions used in the body modeling are modified by the user, surfaces which have been generated by fitting regions are also recalculated and the body model is updated automatically. The region modification can happen when the user includes more data in the region, excludes data from the region, smoothes geometry, or uses other editing functions.

In one embodiment of the present invention a method for performing 3D CAD part body modeling using 3D scan data includes the step of providing a collection of 3D scan data representing the shape of a three dimensional object. The 3D scan data forms a model representing the three dimensional object. The method also provides a CAD system being used to remodel at least one CAD part body and segments the model into multiple mesh regions. Additionally the method selects data from at least one of regions. The selected data is used to programmatically imply a surface body representing the region. The surface body is used as an input argument to a CAD part body modeling operation.

In another embodiment of the present invention a system for performing 3D CAD part body modeling using 3D scan data includes a collection of 3D scan data representing the shape of a three dimensional object. The 3D scan data forms a model representing the three dimensional object. The system also includes a CAD application being used to remodel at least one CAD part body with a part body modeling operation. The part body modeling operation allows the use of a surface body modeling input argument. Additionally the system includes at least one identified region in the model that is associated with a portion of the 3D scan data. The system also includes a user interface enabling the selection of the data associated with the identified region. The selected data is used to programmatically imply a surface body representing the region that is used as an input argument to the CAD part body modeling operation.

In one embodiment, a method for performing 3D CAD part body modeling using 3D scan data includes the step of providing a collection of 3D scan data representing the shape of a three dimensional object that cumulatively forms a model of the three dimensional object. The method also selects at least one region in the model and calculates an implied surface for the at least one region. The implied surface is used as an input argument to a CAD part body modeling operation.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

FIGS. 5A and 5B show the selection and addition of another mesh region;

FIGS. 6A and 6B depict the use of the line selection tool and the 'split' command;

FIGS. 15A and 15B depicts the use of the implied surface of a mesh region to perform a CAD cutting operation.

DETAILED DESCRIPTION

Embodiments of the present invention provide a user performing reverse engineering using 3D scan data with tools which allow the direct use of the 3D scan data during CAD part body modeling operations. The implied surfaces present in user selected model regions are programmatically calculated/approximated using techniques such as surface fitting or interpolation. The implied surface is then provided to CAD part body modeling operations which accept surface body input arguments. The ability to directly use the scan data without creating an intermediate CAD part body from the 3D scan data before performing a part body modeling operation represents a significant time and effort savings to the designer. User changes to regions of the model which have been previously used in the CAD part body modeling operations trigger an automatic recalculation of the implied surface and the part body modeling operation using the newly recalculated implied surface.

Figure 1:
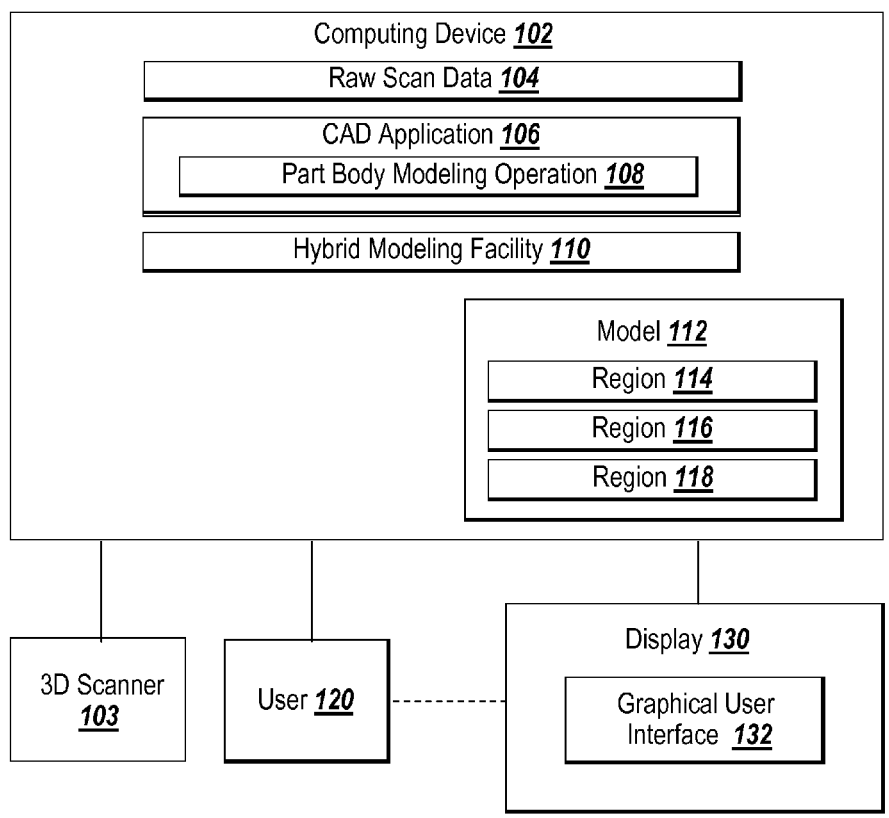
FIG. 1 depicts an environment suitable for practicing an embodiment of the present invention.

FIG. 1 depicts an environment suitable for practicing an illustrative embodiment of the present invention. A computing device 102 includes a collection of raw 3D (three-dimensional) scan data 104 for a scanned three-dimensional object. The raw 3D scan data 104 may be collected from a 3D scanner 103 that is in communication with the computing device 102 or may be a previously stored collection of scan data. The computing device 102 also hosts a CAD application 106 and hybrid modeling facility 110. The computing device 102 may be a workstation, server, laptop, mainframe, PDA, a cluster of devices operating together, a virtual device or another computing device able to support the CAD Application 106 and hybrid modeling facility 110 discussed herein. The hybrid modeling facility 110 is an executable software process or application that is discussed in further detail below. The hybrid modeling facility 110 may be implemented as one or more application processes, one or more application plug-ins or as a stand-alone application. In one implementation of the present invention, the hybrid modeling facility 110 is integrated into the CAD application 106 as a software tool. In another implementation, the hybrid modeling facility 110 is in communication with the CAD application 106 but is not part of the CAD application. The CAD application 106 includes at least one part body modeling operation 108 that accepts surface bodies as modeling input arguments. The part body modeling operation 108 is discussed in further detail below.

The raw scan data 104 is a collection of high resolution points in three dimensions representing the shape of a scanned object. In one implementation, the raw scan data 104 is a set of triangular meshes but the use of other forms of scan data is also considered to be within the scope of the present invention. For example, the raw scan data 104 may be points, triangular meshes, quad meshes, tetrahedral meshes or hexahedral meshes. Collectively the set of meshes form a mesh model representing the surface of the scanned object. Alternatively, the raw scan data may be formed into a point cloud model representing the surface of the scanned object. The hybrid modeling facility 110 generates a graphical user interface (GUI) 132 on a display 130 that allows a user to manually or programmatically segment the model 112 into mesh regions or point cloud model regions 114, 116 and 118. The GUI 132 enables a user 120 to select a particular region 114, 116 or 118 in the model 112 and a part body modeling operation 108 for which the user would like to use the data as input. The hybrid modeling facility 110 analyzes the raw scan data 104 as set forth further below and calculates an approximate implied surface for the selected region. The calculated implied surface is provided as an input argument for the part body modeling operation 108 without the need to represent the region first as a separate CAD part body model. Exemplary CAD part body modeling operations include extruding to a surface and trimming a surface or region and replacing faces in a surface body with a new surface body.

Figure 2:
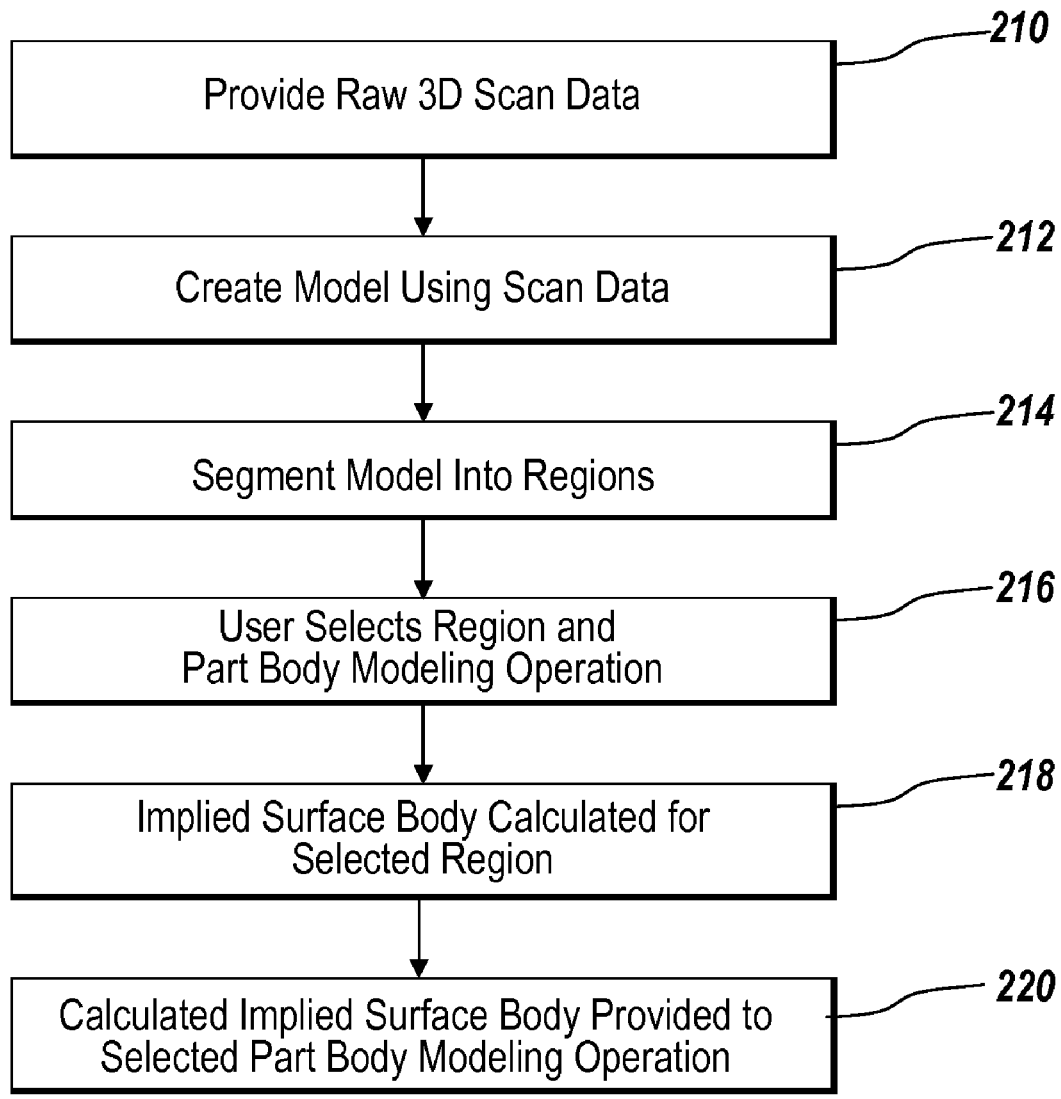
FIG. 2 is a flowchart of a sequence of steps that may be followed by an embodiment of the present invention to directly use 3D scan data from a model region in part body modeling operations.

FIG. 2 is a flowchart of a sequence of steps that may be followed by an embodiment of the present invention to directly use 3D scanned data in part body modeling operations. The sequence of steps begins with the provision of a collection of raw 3D scan data 104 (step 210). The raw 3D scan data 104 may be gathered immediately prior to performing a part body modeling operation. Alternatively, the raw 3D scan data 104 may be previously stored scan data. A model 112 is created from the scan data 104 (step 212). The model may be a mesh model. It should be noted that in an alternative implementation, a point cloud model may be created instead of a mesh model and that the techniques discussed herein that reference a 'mesh model' may also be practiced using a point cloud model without departing the scope of the present invention. The model 112 is segmented into different regions 114, 116 and 118 either manually as a result of a user command or programmatically (step 214). A user 120 viewing the model 112 on the display 130 uses a GUI 132 to select one or more regions 114, 116 and/or 118 and a part body modeling operation 108 for which the user wishes the hybrid modeling facility 110 to calculate an approximation of the surface value (step 216). The hybrid modeling facility 110 then analyzes the raw scan data 104 for the selected region 114, 116 and/or 118 as set forth further below to calculate an implied surface body for the selected region (step 218). The implied surface body is provided as an input argument to the selected part body modeling operation 108 which is then performed (step 220).

Figure 3A:
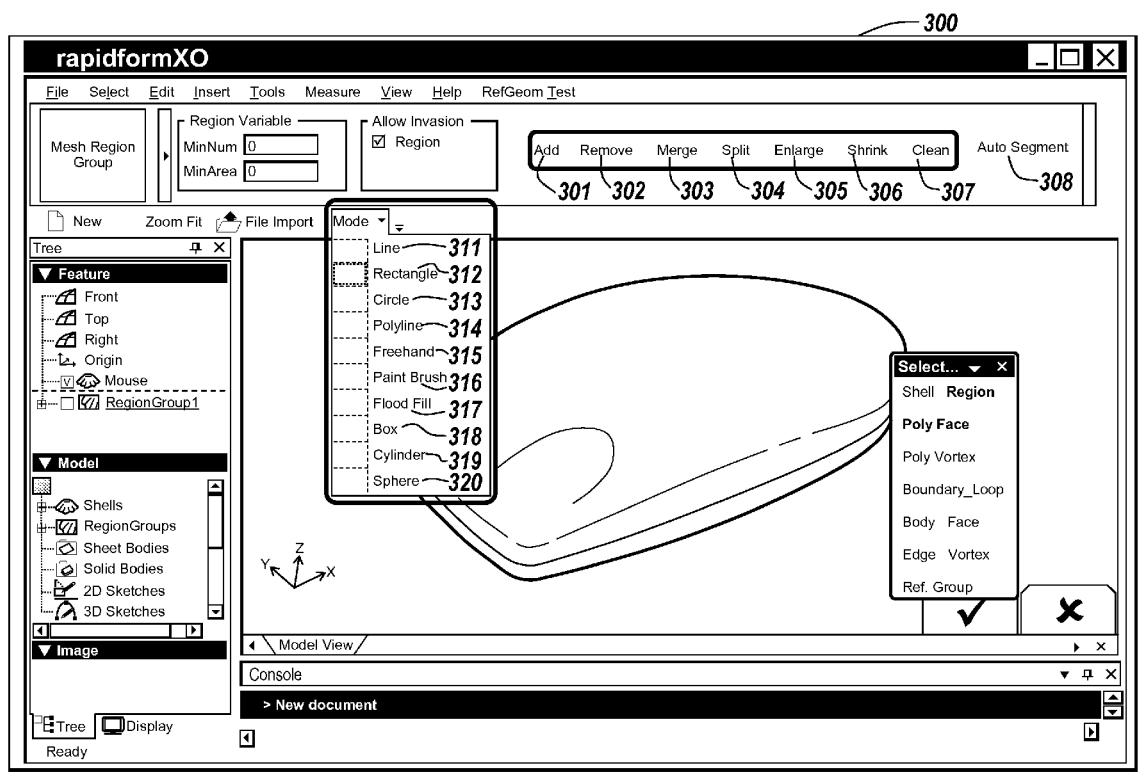
FIG. 3A depicts a user interface providing segmentation and polygon selections tools.

The hybrid modeling facility 110 generates a GUI that allows a user to select a type of part body modeling operation 108 and a mesh region (or region of a point cloud model) 114, 116 or 118 to provide the input for the selected part body modeling operation. FIG. 3A depicts an exemplary user interface 300 that may be generated by the hybrid modeling facility 110. It will be appreciated by those skilled in the art that other user interfaces may be used in place of the GUI 300 shown in FIG. 3A without departing from the scope of the present invention. The GUI 300 includes manual region segmentation tools such as Add 301, Remove 302, Merge 303, Split 304, Enlarge 305, Shrink 306 and Clean 307. The clean tool 307 may be used to remove unnecessary mesh regions which have a small number of triangles or a relatively small area. The hybrid modeling facility may also provide an auto segment feature 308 that automatically segments the scan data into regions. Additionally, the GUI 300 generated by the hybrid modeling facility 312 provides the user with selection tools to select and edit particular areas in a region. Exemplary selection tools include Line 311, Rectangle 312, Circle 313, Polyline 314, Freehand 315, Paintbrush 316, Flood Fill 317, Box 318, Cylinder 319, and Sphere 320. The selection tools may be used repeatedly and intermittently.

Figure 3B:
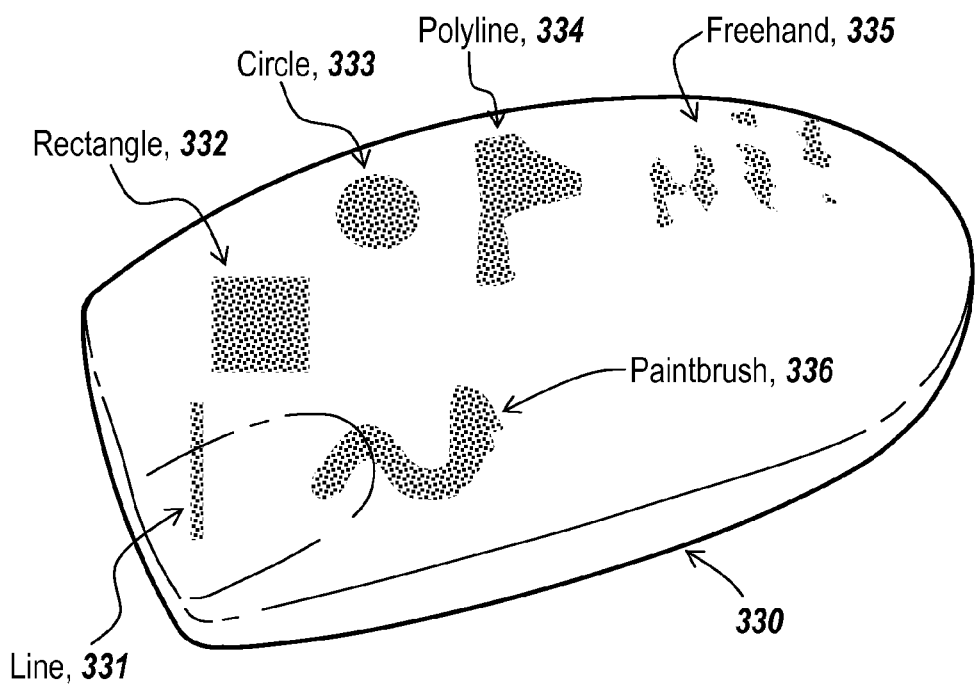
FIG. 3B depicts model regions selected with different selection tools.

The areas of the model selected with the selection tools may be combined to select different portions of a mesh model as shown in FIG. 3B. In FIG. 3B the model 330 is displayed with various model areas selected by a user using different selection tools. For example, the model 330 shows an indicated area 331 that has been selected using a line selection tool 311, an indicated area 332 that has been selected using a rectangle selection tool 312, an indicated area 333 that has been selected using a circle selection tool 313, an indicated area 334 that has been selected using a polyline selection tool 314, an indicated area 335 that has been selected using a freehand selection tool 315, and an indicated area 336 that has been selected using a paintbrush tool 316.

Figure 3C:
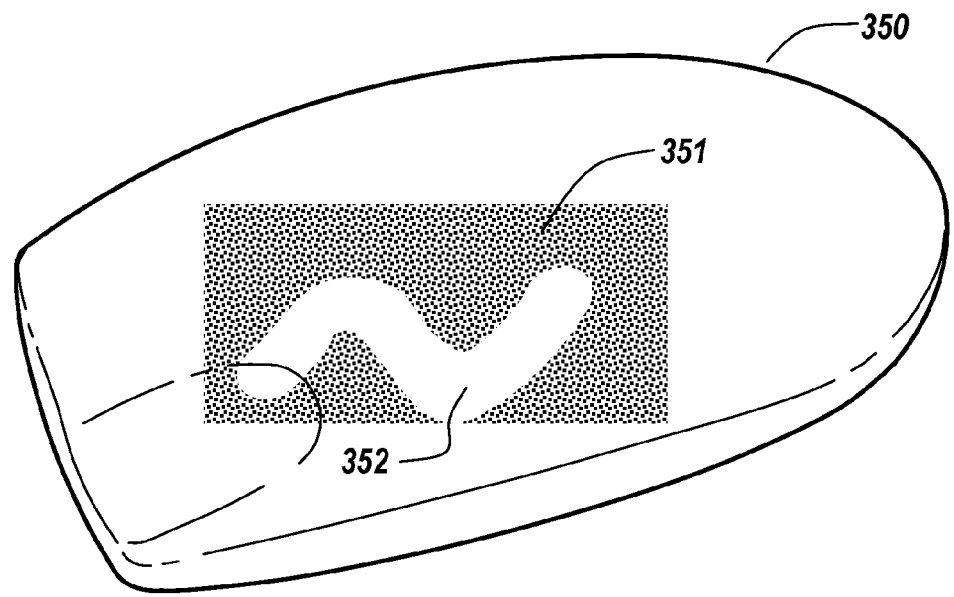
FIG. 3C depicts the net effect of deleting one selection from another selection.

The different selection tools may also be used in combination to delete previously selected areas as shown in FIG. 3C. In FIG. 3C, a model 350 is displayed which shows an indicated area 351 initially selected using a rectangle selection tool 312. Within the indicated area 351 is an additional indicated area 352 which has been deleted using a paintbrush selection tool 316.

Figure 3D:
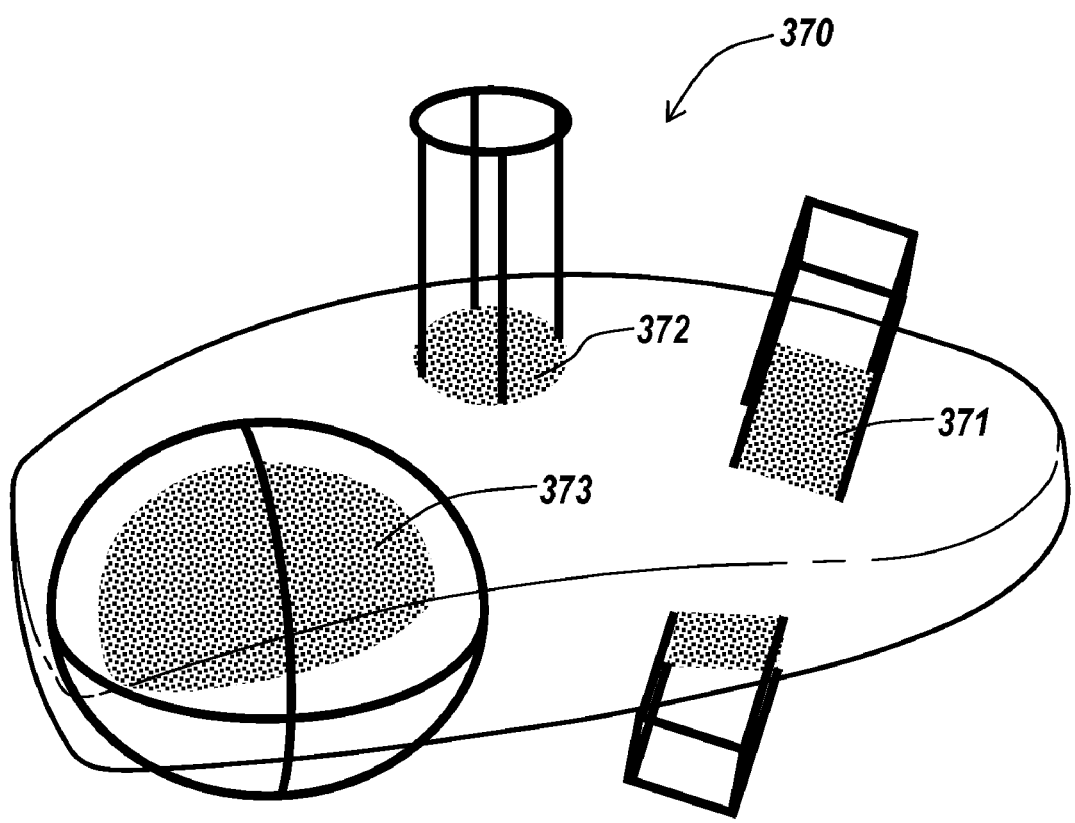
FIG. 3D depicts the use of volume selection tools.

The flood fill selection tool 317 uses a seed face and selects all polygons attached to the seed face. The GUI 300 also provides the user with tools to act on 3D volumes. Whereas many selection tools act on surfaces (i.e.: painting the surface to select mesh polygons using the paintbrush selection tool 316), the Box 318, Cylinder 319 and Sphere 320 selection tools are used to create 3D volumes in the model window. Parts of the mesh located within the created volume are selected. The Box 318, Cylinder 319 and Sphere 320 selection tools allow the user to choose volumes in space. If the mesh falls inside these volumes then the region is selected. FIG. 3D depicts an exemplary use of the volume tools. A mesh model 370 includes an indicated area 371 that has been selected using a box selection tool 318, an indicated area 372 that has been selected using a cylinder selection tool 319, and an indicated area 373 that has been selected using a sphere selection tool 320.

Figure 4:
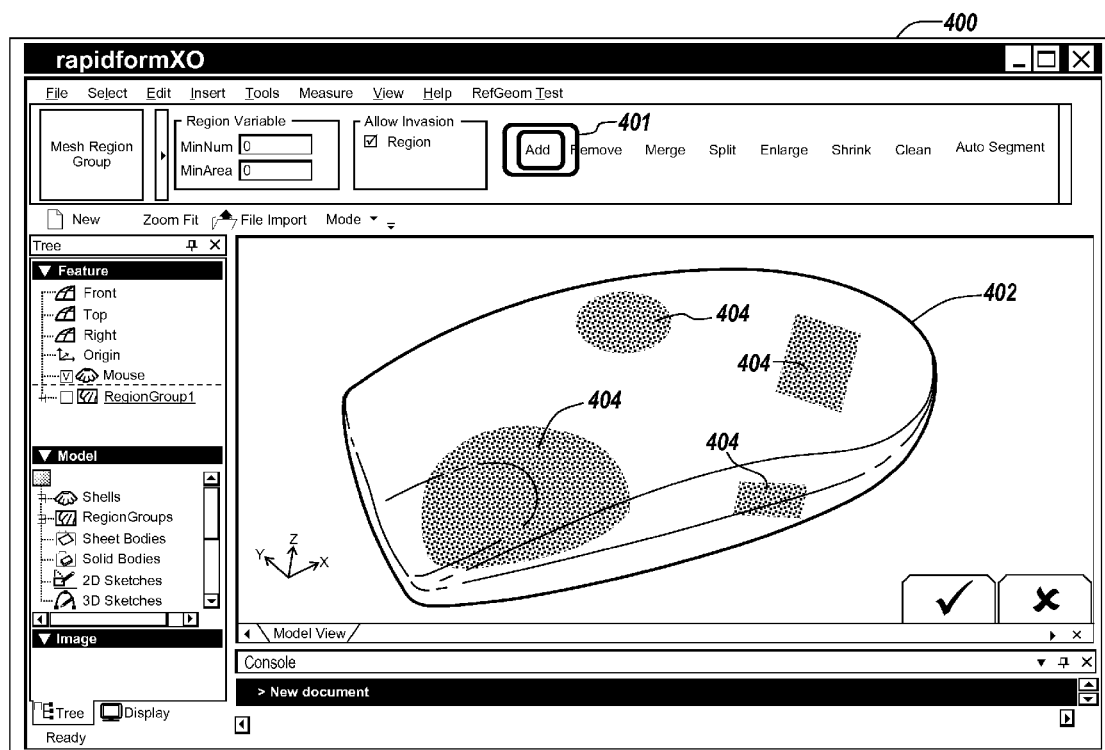
FIG. 4 depicts the addition of mesh selections to a mesh region.

FIG. 4 depicts the use of an exemplary GUI 400 to add a mesh region group 404 to a model 402 after the mesh selection tools have been used. With the mesh region 404 selected using the box 318, cylinder 319 and sphere 320 selection tools, (as shown in FIG. 3D), a user may press an "Add" command 401 to add the mesh region group 404. Mesh region groups may be colored differently depending upon the region group of which they are a member. For example the first region group may be a purple group. Alternatively, other indicators not relying on color may be used to denote the mesh region group.

In one embodiment of the present invention, a user may employ a selection tool in the GUI to select polygons and then use different commands as applicable to create (add) regions. A user can also select regions or else select polygons and regions. If the user selects polygons and regions, additional commands become applicable such as commands to 'merge', 'enlarge', 'shrink', 'remove', 'merge' and 'split'. For example, FIG. 5A depicts the user 20 using a polyline mesh selection tool 314 to select the indicated triangular area 504 in the model 500. The model 500 also includes a previously selected region 502. In one embodiment, the selected triangular area 504 may be shown in red or in another color while the previously selected region 502 may be shown in a different color such as purple. By using the "Add" command from the GUI, the user can add another region group to the model 500. FIG. 5B shows the effect of the use of the add command on the model 500 with the depiction of the selected triangular area 504 changing to indicate that it is now another region group in the model. The additional region group may be indicated by changing the selected triangular area to a new color such as pink (from an original color such as red) and may be referred to as the pink group while the original region 502 could be referred to as the 'purple group'.

Figure 5C:
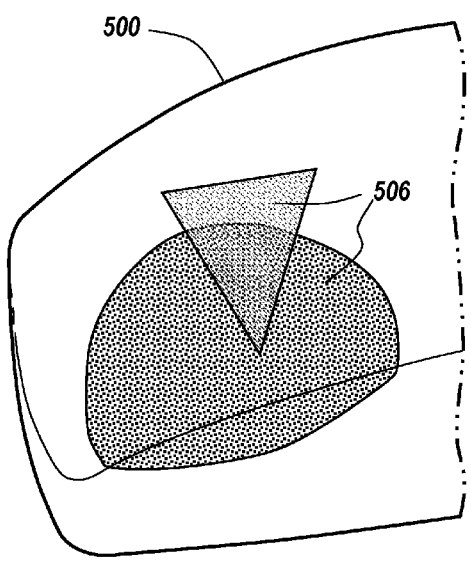
FIGS. 5C and 5D depict the selection and merging of two mesh regions.
Figure 5D:
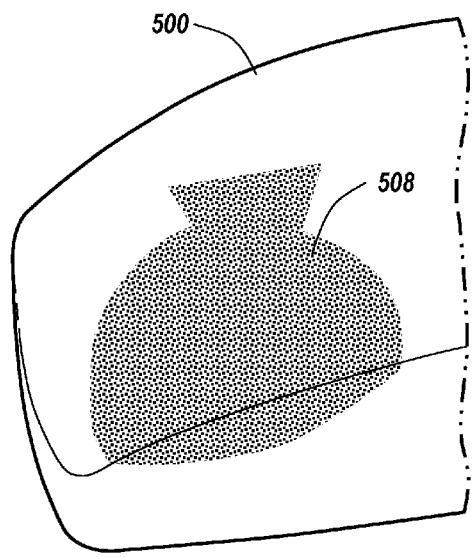

By using a 'Region Selection Tool' provided through the GUI, the user is able to point and click to select the two separate regions such as the pink and the purple regions discussed above. The selected regions may be highlighted in some manner for the user such as by adding red dots. Following the selection of the regions with the region selection tool, the user may use a "merge" command to merge the two selected regions into one region. For example, FIG. 5C depicts the selection with the region selection tool of the two regions 502 and 504 in the model 500. The selected regions may be displayed together 506 with some sort of visual indicator being applied to the two regions in order to indicate that the regions have both been selected. Once selected, a user may select the merge command to merge the two regions. FIG. 5D depicts the merger of the visually indicated area 506 (made up of regions 502 and 504) into a new merged model area 508.

Figure 5E:
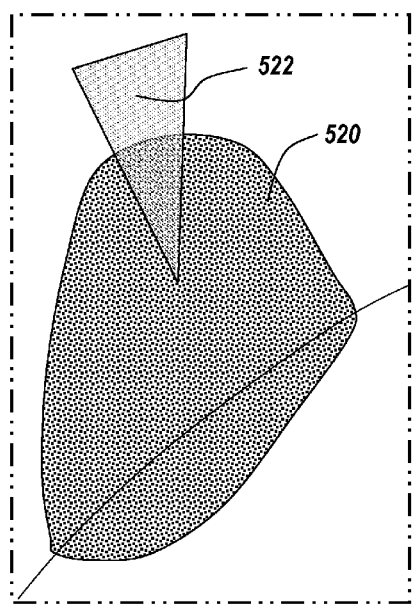
FIGS. 5E and 5F depict the selection of polygons and their subsequent merging with a mesh region.
Figure 5F:
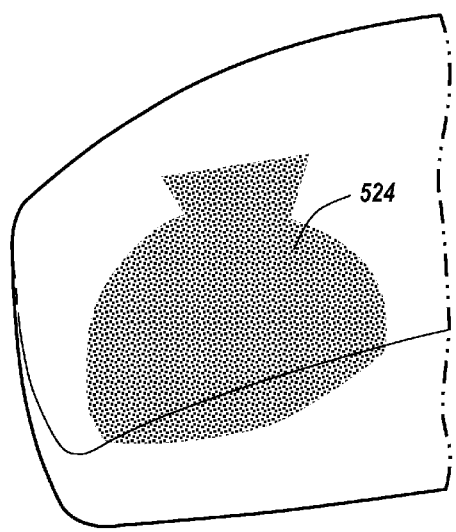

In one embodiment of the present invention, the GUI also allows the user to mix polygon selections and region selections and then merge the two selections to create one merged region. FIG. 5E depicts the selection of polygons 520 and a region 522. FIG. 5F depicts the effect of a user merging the selected polygons 522 and the selected region 520 into a single merged region 524 using a merge command.

An additional tool which is provided through the GUI 132 generated by the hybrid modeling facility 110 is the line selection tool 311. FIG. 6A depicts a polygon selection 602 made using the line selection tool 311 that bisects a region

604. A user may select a "Split" command 304 causing the region 604 to split along the polygon line selection 602. The effect of the split command is to create another region 606 as shown in FIG. 6B. As noted previously, the different regions and selections may be indicated with different colors such as by displaying a purple line 602 through a pink region 604 in FIG. 6A and separate orange 606 and purple regions 604 in FIG. 6B.

Figure 7A:
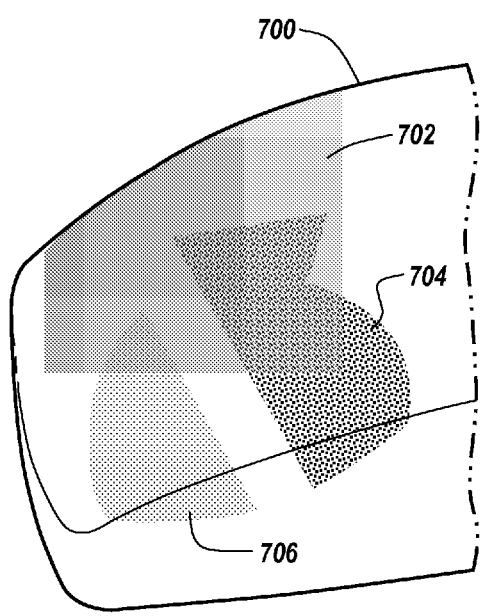
FIGS. 7A and 7B depict the use of the rectangle selection tool and the 'remove' command.
Figure 7B:
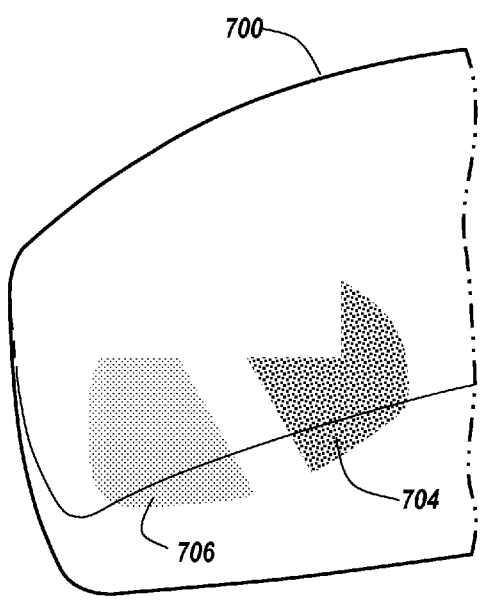

A remove command may also be accessed through the GUI. FIG. 7A depicts the use of a rectangle selection tool 312 to make a rectangular selection 702 in a model 700. The rectangular selection 702 overlaps two regions 704 and 706 in the model 700. The GUI 132 allows a user to select and apply a remove command to the rectangular selection 702. The effect of the application of the remove command is to remove the rectangular selection and the overlapped portions of the other regions 704 and 706. FIG. 7B depicts the model 700 and the reduced regions 704 and 706 after the application of the remove command to the rectangular area 702.

Figure 8A:
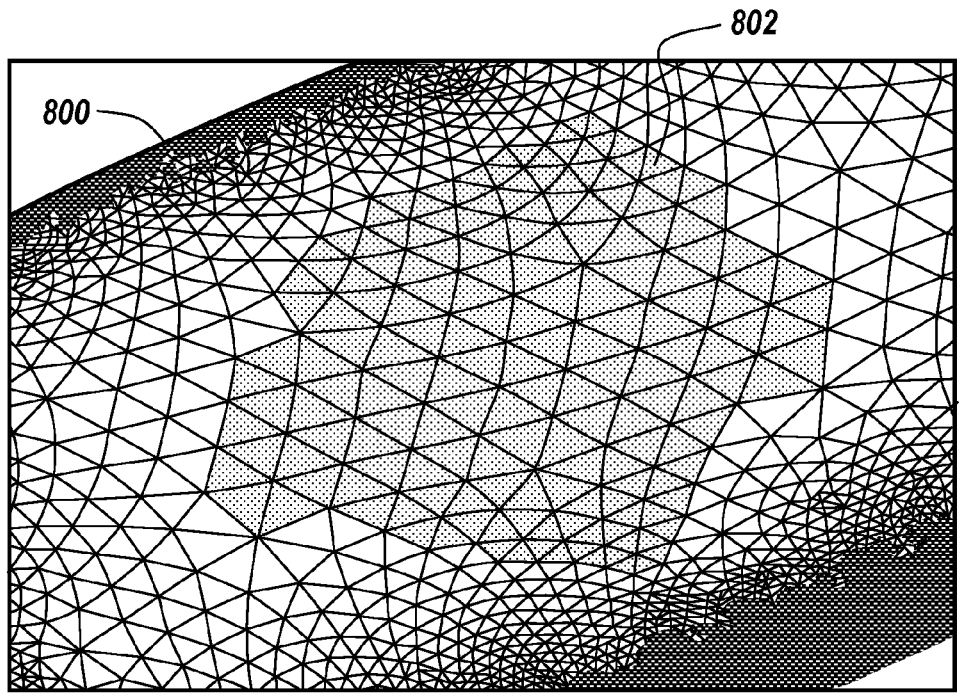
FIGS. 8A to 8C depicts a mesh region and its subsequent shrinking and enlarging using the tools of the present invention
Figure 8B:
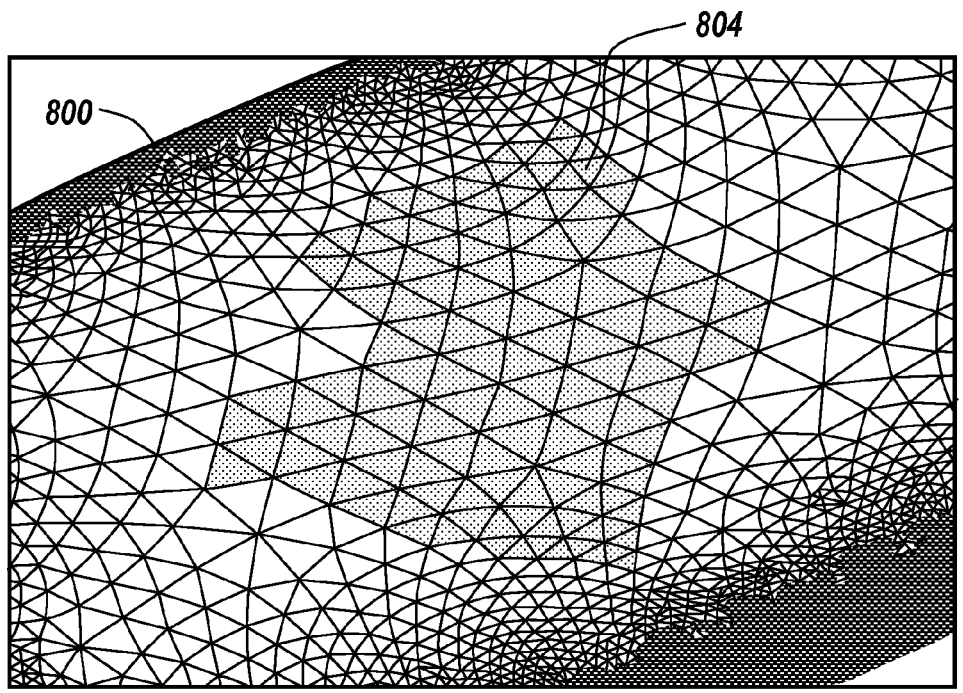
Figure 8C:
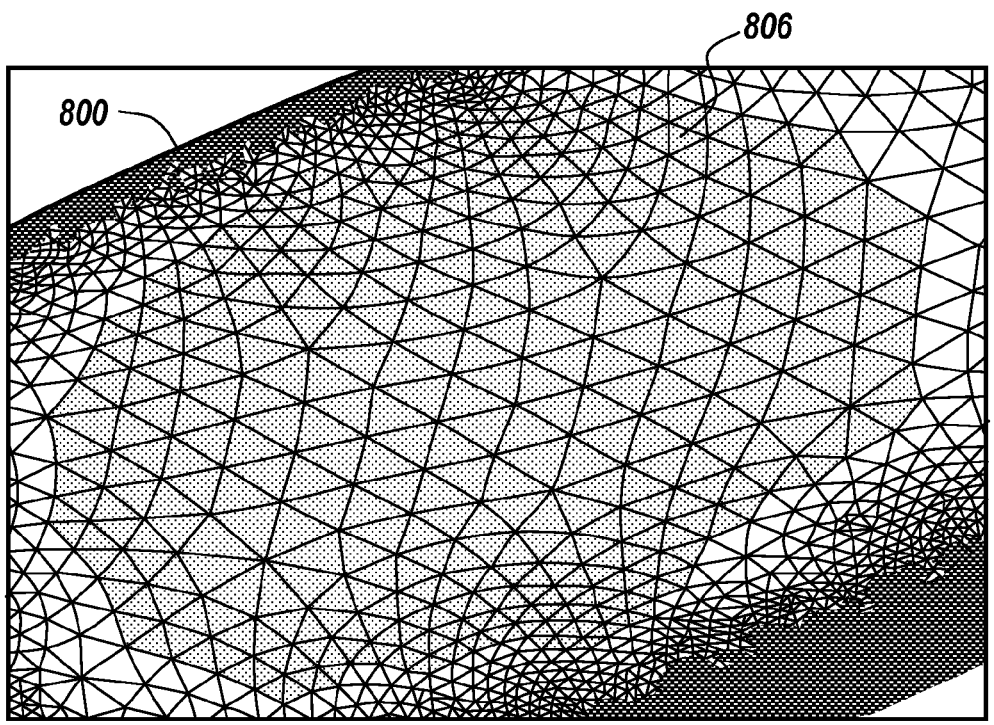

The GUI 132 also may provide shrink and enlarge mesh selection tools to a user. FIG. 8A shows an initially selected region 802 of a mesh model 800. FIG. 8B shows the region of FIG. 8A after one or more applications of a 'shrink' command. The effect of the application of the shrink command is to select a smaller sub-region 804 of the initially selected region 802 of FIG. 8A. It will be appreciated that the amount of the shrinkage of the initially selected region 802 that occurs upon selection of the 'shrink' command may be a pre-determined static amount. Alternatively, the amount of shrinkage that occurs upon the selection of the 'shrink' command may be configurable by the user through the GUI 132 or in some other manner. FIG. 8C shows an enlarged region 804 that is selected after one or more applications of an 'enlarge' command. As with the 'shrink' command, the exact amount of enlargement that occurs may be a static amount or a user-configurable amount. The GUI 132 thus provides a user with a uniform way to incrementally alter the size of the region to the user's satisfaction. It should be noted that although the description of the present invention uses the names of various commands that may be offered by the hybrid modeling facility, the names of the commands are not essential to the present invention and other commands with different names that contain the same functionality may be substituted for those described herein without departing from the scope of the present invention.

The region groups that are selected and produced using the tools in the GUI 132 may be used in CAD remodeling. The hybrid modeling facility 110 allows the user to fit surfaces to these regions groups with control over the surface fitting parameters such as UV axis and the number of control points. The surfaces may be used in CAD remodeling processes in areas such as trimming with a surface and extruding up to a surface. The hybrid modeling facility 110 also enables the surfaces to be implied by region when performing CAD remodeling processes. For example, with the hybrid modeling facility 110, a region implies a surface (using either a default or user-chosen surface fitting parameters) thereby allowing a user to choose a region and perform CAD operations (that would typically require a surface) such as an 'extrude to region' operation (using the surface implied by the region selection). For instance, in the 'extrude' command, an 'up to region' option may be available as well as an 'up to surface/face' option. A surface may be calculated by the hybrid modeling facility 110 by fitting the region into the most appropriate parametric surface form. A specified 2D sketch profile may then be extruded up to the calculated surface. The region's implied surface may be automatically updated if the region changes. For example, a region's implied surface that has been extruded to may be updated if a "merge" command or "remove" command is performed on the region. Geometrical or topographical changes in the raw scan data are also propagated to an implied surface. For example, if a 'smooth' command is selected for a region, the position of every point in the region will be changed and the region's implied surface is then updated automatically.

Figure 9A:
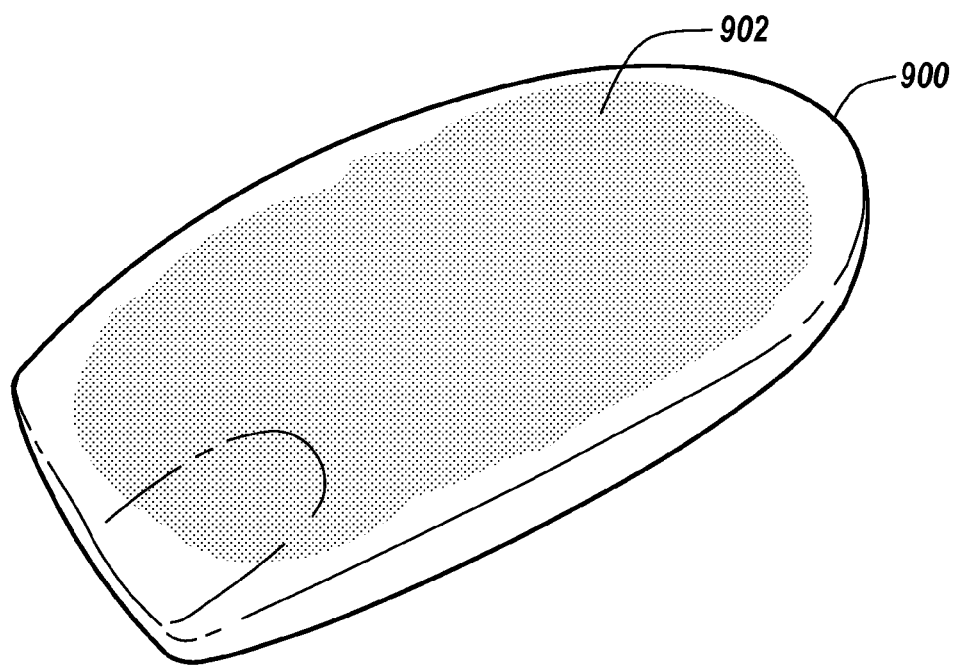
FIG. 9A depicts the selection of a mesh region.
Figure 9B:
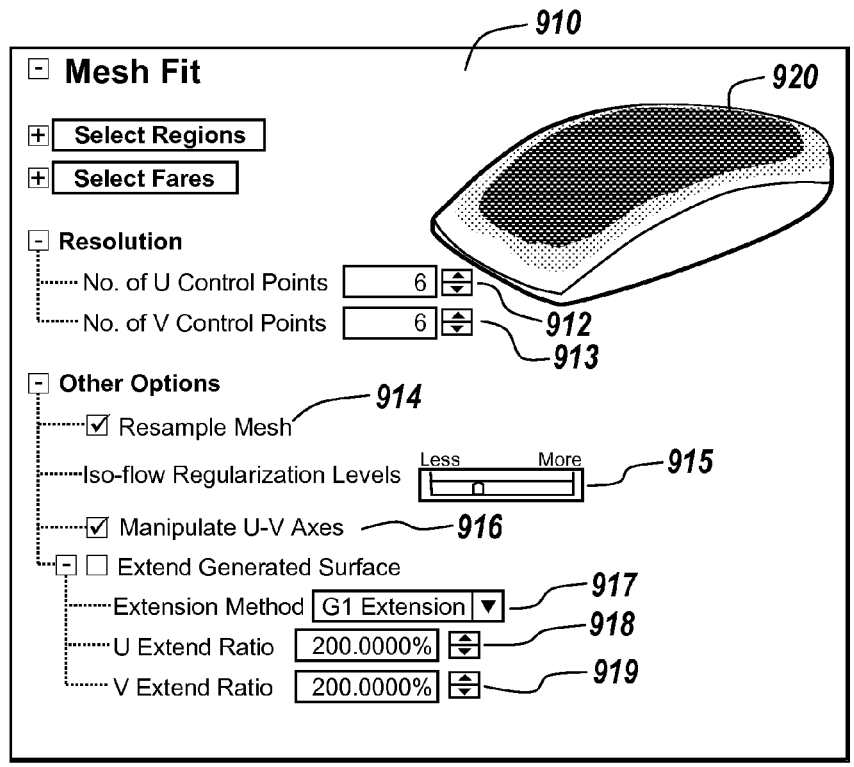
FIG. 9B depicts a user interface enabling the selection of surface fitting parameters for the mesh region selected in FIG. 9A.
Figure 9C:
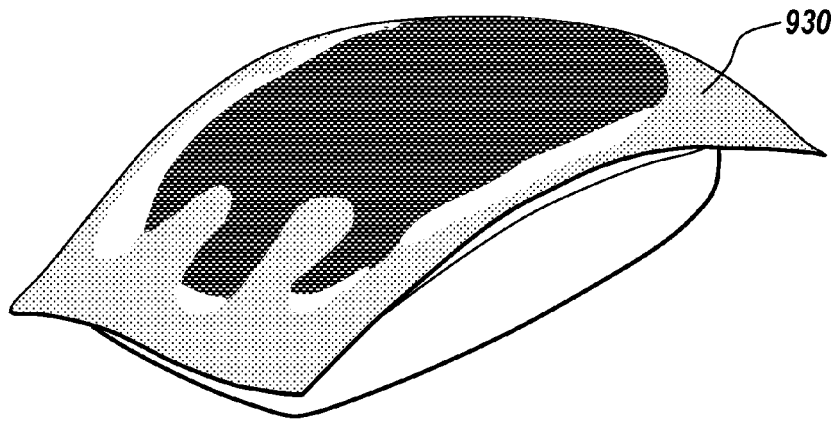
FIG. 9C depicts the resulting fit surface.

The hybrid modeling facility 110 applies a G1 (tangent) or higher order (G2, etc.) extension (default is G1) if the extruded sketch does not intersect the original size of the implied surface's fit to the mesh. For example, FIG. 9A shows a model 900 upon which an initial mesh region 902 has been selected. FIG. 9B depicts a user interface 910 provided by the hybrid modeling facility 110 from which the user can use a surface creation function to choose surface fitting parameters. The user interface 910 also provides a preview 920 of the surface fit for the selected region. The user interface 910 may allow the user to control the surface fitting parameters such as the number of U control points 912 and number of V control points 913. The user interface 910 may allow a user to specify that the mesh be re-sampled 914, that ISO-flow regularization levels be adjusted 915, and that the U-V axes be manipulated 916. The user interface 910 may also allow the user to specify the type of extension method that is to be used in performing the surface creation. For example, the G1 extension method has been selected in FIG. 9B. In one embodiment, the user interface 910 may allow the user to control the amount of the U-extend ration 918 and/or the V-extend ratio 919. For example, both the U-extend ratio and V-extend ratio have been selected to be 200.0000% in FIG. 9B. FIG. 9C shows he resulting fit surface 930 that is calculated using the surface fitting parameters chosen via the interface 910 for the mesh region 902. There is a small (default) amount of G1 extension on the surface fit, meaning the surface extends past the region that is being fit. If the user specified a larger amount of G1 extension (or G2 (curvature) extension), then the surface would be proportionately larger based on this extension parameter.

Figures 10A, 10B, 10C:
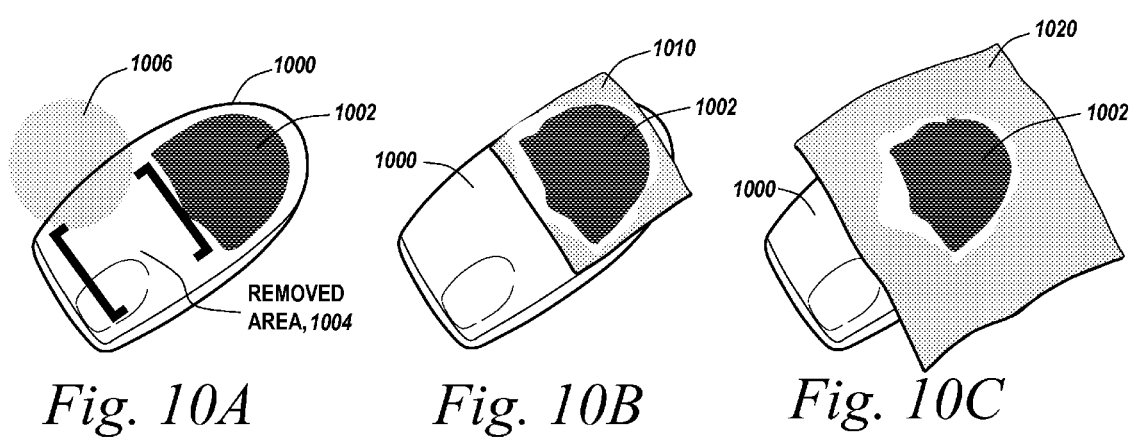
FIGS. 10A-10C depict the refitting of a surface fit following the editing of a mesh upon which the surface fit is based.

FIGS. 10A-10C depict the automatic refitting process that may be engaged in by an embodiment of the present invention. FIG. 10A depicts a mesh model 1000 which includes a remaining mesh region 1002 and a removed area mesh region 1004 that has been removed from the remaining mesh region. The removal of the removed area 1004 may be performed with a number of techniques in a mesh region editing/modification mode provided by the hybrid modeling facility 110. One such exemplary technique includes the use of the depicted paintbrush selection tool 1006 which may be dragged through a displayed mesh region to perform the removal. In an embodiment, after the removal of the removed area 1004, the surface 1010 is automatically refit after the user exits from the mesh region editing/modification mode. FIG. 10C depicts the ability of an embodiment of the present invention to further modify the re-calculated fit surface 1020 by changing the amount of surface fit extension. In FIG. 10C, the fit surface 1020 has undergone a 75% G1 extension in both the U & V directions.

Figure 11A:
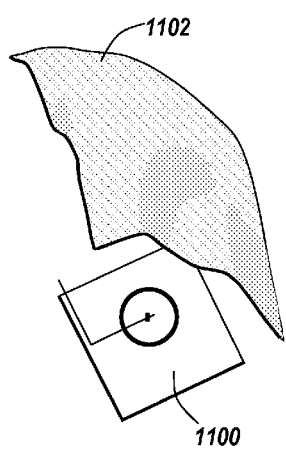
FIGS. 11A-11C depict the selection and operation of an 'extrude to surface' parameter.
Figure 11B:
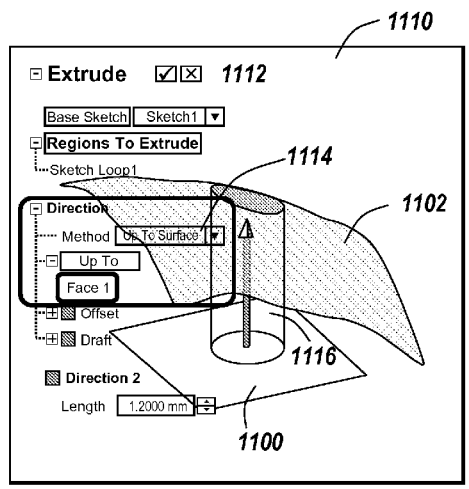
Figure 11C:
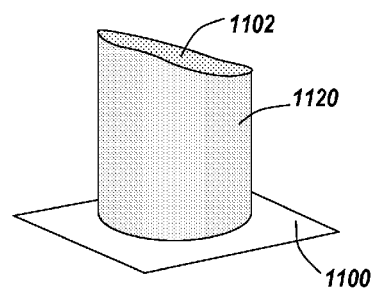

Some of the CAD operations that may be performed by embodiments of the present invention include extruding a solid to an implied surface. This type of operation is shown in FIGS. 11A-11C. FIG. 11A depicts a CAD sketch 1100 being drawn near a mesh region 1102 for which an implied surface will be calculated. FIG. 11B depicts a user interface 1110 that may be generated by an embodiment of the present invention. The user interface includes a selectable extrude parameter 1112 as well as additional configurable parameters controlling the method of the extrusion 1114. For example, the selected method in FIG. 11B indicates the base sketch 1100 should be extruded 'up to surface'. A preview of the extruded sketch component 1116 is also provided by the user interface 1110. FIG. 11C depicts the extruded solid 1120 that uses the surface 1102 implied from the mesh data for its top face. In one embodiment, if the user changes any of the fitting parameters of the surface 1102, or edits the scan data or region of the scan data from which the surface is implied, then the user will also see changes in the extruded solid 1120 because it is linked to the surface.

The hybrid modeling facility 110 automatically identifies which surface type such as a plane, a sphere, a cylinder, a cone, a torus or a freeform is the best suited for representing a mesh region. Surface parameters may be automatically calculated according to the identified type. The modeling options and parameters may all be stored internally in a database.

Figure 12A:
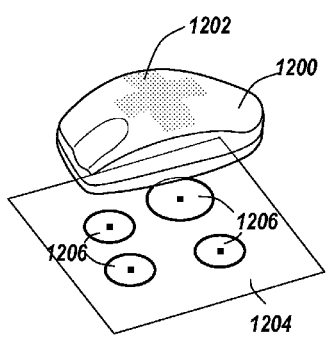
FIGS. 12A-12C depict the selection and operation of an 'extrude to region' parameter.
Figure 12B:
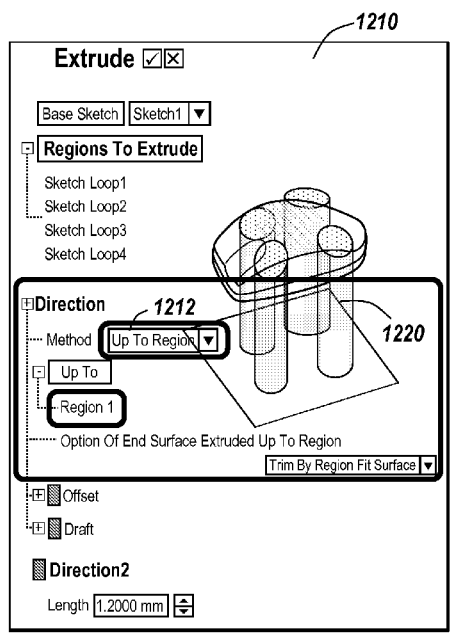
Figure 12C:
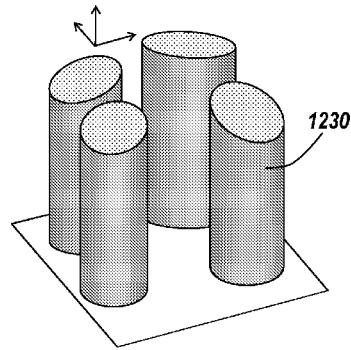

As previously noted, regions may be used to imply surfaces. During CAD operations that use surfaces (using default surface fitting parameters) the hybrid modeling facility 110 can substitute regions. Thus, FIG. 12A depicts a mesh region 1202 being added to the top of the model 1200. A base sketch 1200 is also depicted which includes four circles 1206. FIG. 12B depicts the user choosing extrusion parameters 'up to region' 1212 in the user interface 1210 in order to extrude the four circles 1206 up to an implied surface for the mesh region 1202. A preview 1220 of the result is also displayed by the user interface 1210. FIG. 12C shows the resulting extrusion which uses the region's implied surface and the software performs G1 extension to the region's implied surface so that the extrusion 1230 intersects with the implied surface.

Figure 13A:
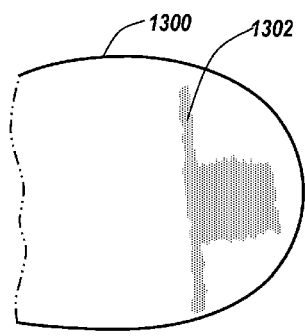
FIGS. 13A-13C depict the automatic recalculation of a part body operation following a user editing a mesh region used as input argument for the operation.
Figure 13B:
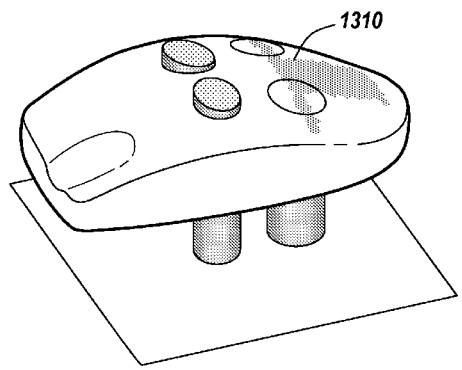
Figure 13C:
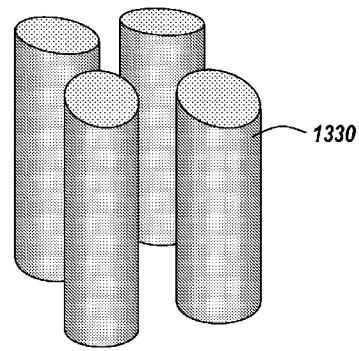

If the region initially selected as input for a CAD part body modeling argument is edited by the user, the hybrid modeling facility 110 automatically rebuilds the body by repeating the process discussed above. FIG. 13A depicts a model 1300 that includes an edited mesh area 1302. The editing of the mesh region 1302 affects the implied surface that is based on the region and the extrusions to the region. FIG. 13B shows the model 1300 with a recalculated implied surface 1310. FIG. 13C depicts the modification of the extruded parts 1330 to take into account the modified implied surface caused by the modification of the underlying mesh region. Other options for using regions in the 'extrude to region' command for freeform surfaces are to use the Max, Middle, or Min distance of the region. These do not calculate an implied surface, but the resulting part body is changed if there are changes in the regions.

Although the examples above discuss regions where a freeform surface is appropriate, it will be appreciated by those skilled in the art that other surfaces such as spheres, cones, planes, cylinders or torus, etc. may be substituted if more appropriate to the analytic shape without departing from the scope of the present invention.

Figure 14A:
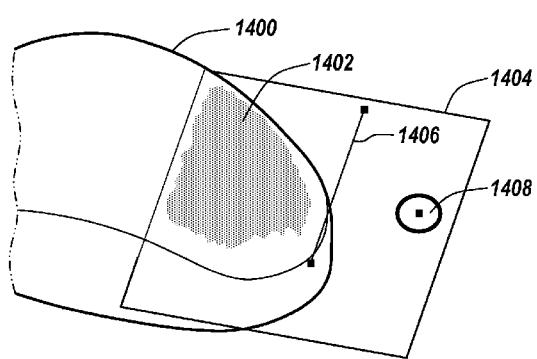
FIGS. 14A and 14B depict the use of a "revolve to region" command with mesh data supplying the input argument.
Figure 14B:
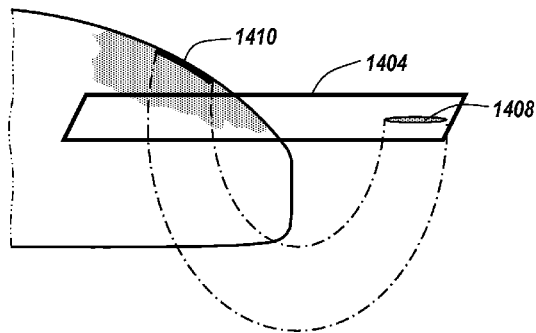

The hybrid modeling facility 110 also allows the user to revolve to a region rather than extruding to a region. The 'Revolve to Region' command operates the same as the 'extrude to region' command except that the implied surface is used as an end surface to which the revolving sketch may be revolved. FIG. 14A depicts a selected mesh region 1402 in a model 1400 and sketch 1404. The sketch 1404 has a rotation profile and centerline 1406. The sketch includes a circular area 1408 that is to be revolved to the implied surface for the selected mesh region 1402. FIG. 14B depicts the effect of the execution of a "revolve to region" command in one direction. The revolution extrudes to the mesh region's implied surface 1410. Put another way, the sketch plane is revolved around the centerline 1406 until the circular area 1408 has been rotated around to overlap the implied surface for the mesh region 1402. Because the solid intersects with the region, the user knows the implied surface will be there (if it were not, a G1 extension would apply). A G1 (tangent) extension of the surface applies if the revolving profile does not intersect with the original size of the implied surface. The implied surface is automatically extended so it is intersected by the solid. This extension idea is identical to the 'extrude to region's' implied surface extension discussed above.

Cutting with surfaces is a typical CAD operation. The hybrid modeling facility 110 takes advantage of the implied surface of a mesh region to create a cut by region. For example, as shown in FIGS. 15A and 15B, the implied surface can be used to perform a cut on a rectangular solid. FIG. 15A shows a model 1500 which includes a rectangular solid 1504 that intersects part of a selected mesh region 1502. The hybrid modeling facility 110 performs a G1 (tangent) extension to extend the implied surface calculated for the mesh region 1502 and to make a complete cut through the solid 1504. The extension is necessary as a portion of the solid 1504 lies well outside of the selected mesh region 1502 and its implied surface. FIG. 15B shows the result of the cut operation as the reduced rectangular solid 1508 has been lowered to the level of the implied surface that was calculated for the selected mesh region 1502.

In one aspect of the present invention, the hybrid modeling facility 110 may be used to create a model by trimming and merging selected surfaces. A 'trim and merge' command is made available via a user interface. After selecting the command, a user selects input bodies for the command and then indicates through the user interface that the command should be applied. The trim and merge command automatically checks intersections between selected surfaces and splits surfaces along their intersection curves. Unnecessary parts of surfaces which do not take part in making a closed region or the biggest open region are then removed.

In another aspect of the present invention, the hybrid modeling facility 110 provides a user interface which enables the selection of a 'replace face' command that allows a user to replace faces in a surface or solid body with new surface bodies. After selecting the command through the user interface, the user selects a target face in a solid or surface body that the user wishes to replace and selects one or more replacement surfaces to take the place of the target face. The term 'solid body' refers to a set of surfaces forming a closed region while the term 'surface body' refers to a set of surfaces forming an open region. The hybrid modeling facility 110 may replace a single face or set of connected faces with a surface body or may replace more than one set of connected faces with the same number of surface bodies in a single operation. The replacement surface body does not need to have the same boundaries as the old faces. In the event that the replacement faces are larger than the target faces, the adjacent faces to the target face in the original body extend and trim to the replacement surface body. In the event that the replacement surface body is smaller than the target face or faces, the replacement surface or surfaces are automatically extended to meet the faces in the original body that were adjacent to the target face. The replacement surface body can be a surface features such as an extrude surface feature, loft feature and/or fill feature. The replacement surface body can also be a knit surface body or a complex imported surface body.

It should be noted that throughout the description of the present invention contained herein, reference is made to specifically named commands and operations. It should be appreciated that the names given to the commands and operations discussed herein are meant in an exemplary fashion only and that other names for operations and/or commands providing similar functionality to the named commands and operations discussed herein may be utilized without departing from the scope of the present invention.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include FORTRAN, C, C++, C#, or JAVA. The software programs may be stored on or in one or more mediums as object code. Hardware acceleration may be used and all or a portion of the code may run on a FPGA or an ASIC. The code may run in a virtualized environment such as in a virtual machine. Multiple virtual machines running the code may be resident on a single processor.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method for performing 3D CAD part body modeling using 3D scan data, comprising:
    providing a collection of 3D scan data representing the shape of a three dimensional object, the 3D scan data forming a model representing the three dimensional object;
    providing a CAD system being used to remodel at least one CAD part body;
    segmenting the model into a plurality of regions;
    receiving a selection of data from at least one of the plurality of regions, the selected data used to programmatically imply a surface body representing the region, the implied surface body used as an input argument to a CAD part body modeling operation;
    performing the CAD part body modeling operation using the implied surface body;
    receiving a selection of the modifying of the 3D scan data, the modifying altering the 3D scan data geometrically or topologically;
    automatically modifying the implied surface body based on the modifying of the 3D scan data; and
    performing the CAD part body modeling operation using the modified implied surface body as an input argument.

2. The method of claim 1 wherein the model is a mesh model.

3. The method of claim 1 wherein the model is a point cloud model.

4. The method of claim 1, further comprising:
    programmatically identifying a type of surface body to represent the region.

5. The method of claim 4 wherein the surface type is selected from a group comprising a plane, a sphere, a cylinder, a cone, a torus and/or a freeform.

6. The method of claim 5, further comprising:
    programmatically calculating at least one surface parameter for the region based on the identified type.

7. The method of claim 6 wherein the at least one surface parameter relates to a parameter selected from the group comprising: a parameter related to the UV axis, a parameter related to the number of U control points, a parameter related to the number of V control points, a parameter related to fitting tolerance, the fitting tolerance being an amount of deviation between the implied surface body and the region, a parameter related to a smoothness of the region and/or a parameter related to the extension of the surface body.

8. The method of claim 1, further comprising:
    displaying a preview of the implied surface body to a user.

9. The method of claim 1 wherein the CAD part body modeling operation is selected from a group comprising an extrude to surface operation, a trimming of a surface operation, a trim and merge operation, an operation replacing a face on a surface body and a cutting operation.

10. The method of claim 1 wherein the data is selected from the at least one region with the aid of a selection tool provided to a user via a graphical user interface.

11. The method of claim 9 wherein the selection tool is selected from the group comprising a line selection tool, a rectangle selection tool, a circle selection tool, a polyline selection tool, a freehand selection tool, a paintbrush selection tool, a flood fill selection tool, a box selection tool, a cylinder selection tool and/or a sphere selection tool.

12. The method of claim 1, further comprising:
    editing the selected region; and
    re-identifying automatically a surface type to represent the region.

13. The method of claim 12 wherein the editing of the selected region performs an operation selected from the group comprising adding to the selected region, removing at least a portion of the selected region, merging the selected region with another region, splitting the selected region, enlarging the region and shrinking the region.

14. The method of claim 12, further comprising:
    calculating programmatically surface parameters for the selected region based on the re-identified type.

15. A system for performing 3D CAD part body modeling using 3D scan data, comprising:
    a collection of 3D scan data representing the shape of a three dimensional object, the 3D scan data forming a model representing the three dimensional object;
    a CAD application being used to remodel at least one CAD part body with a part body modeling operation, the part body modeling operation allowing the use of a surface body modeling input argument;
    at least one identified region in the model, the at least one identified region associated with a portion of the 3D scan data; and
    a user interface enabling the receipt of a selection of the data associated with the at least one identified region, the selected data used to programmatically imply a surface body representing the region that is used as an input argument to the CAD part body modeling operation, the user interface further enabling the receipt of a selection modifying the previously selected 3D scan data, the modifying altering the 3D scan data geometrically or topologically, the implied surface body automatically modified based upon the modifying of the 3D scan data and used as an input to the CAD part body modeling operation.

16. The system of claim 15, further comprising:
    a 3D scanner, the 3D scanner capturing the 3D scan data.

17. The system of claim 15 wherein the model is a mesh model.

18. The system of claim 15 wherein the model is a point cloud model.

19. A physical medium holding computer-executable instructions for performing 3D CAD part body modeling using 3D scan data, the instructions when executed causing a computing device to:
a collection of 3D scan data representing the shape of a three dimensional object, the 3D scan data forming a model representing the three dimensional object;
a CAD system being used to remodel at least one CAD part body;
segment the model into a plurality of regions;
receive a selection of data from at least one of the plurality of regions, the selected data used to programmatically imply a surface body representing the region, the implied surface body used as an input argument to a CAD part body modeling operation;
perform the CAD part body modeling operation using the implied surface body: receive a selection of the modifying of the 3D scan data, the modifying altering the 3D scan data geometrically or topologically;
automatically modify the implied surface body based on the modifying of the 3D scan data; and
perform the CAD part body modeling operation using the modified implied surface body as an input argument.

20. The medium of claim 19 wherein the model is a mesh model.

21. The medium of claim 19 wherein the model is a point cloud model.

22. The medium of claim 19, wherein the execution of the instructions further cause the computing device to: programmatically identify a type of surface body to represent the region.

23. The medium of claim 22 wherein the surface type is selected from a group comprising a plane, a sphere, a cylinder, a cone, a torus and/or a freeform.

24. The medium of claim 23 wherein the execution of the instructions further cause the computing device to: programmatically calculate surface parameters for the region based on the identified type.

25. The medium of claim 24 wherein the at least one surface parameter relates to a parameter selected from the group comprising: a parameter related to the UV axis, a parameter related to the number of U control points, a parameter related to the number of V control points, a parameter related to fitting tolerance, the fitting tolerance being an amount of deviation between the implied surface body and the region, a parameter related to a smoothness of the region and/or a parameter related to the extension of the surface body.

26. The medium of claim 19 wherein the execution of the instructions further cause the computing device to: displaying a preview of the implied surface body to a user.

27. The medium of claim 21 wherein the CAD part body modeling operation is selected from a group comprising an extrude to surface operation, a trimming a surface operation, a trim and merge operation, an operation replacing a face on a surface body and a cutting operation.

28. The medium of claim 19 wherein the data is selected from the at least one region with the aid of a selection tool provided to a user via a graphical user interface.

29. The medium of claim 28 wherein the selection tool is selected from the group comprising a line selection tool, a rectangle selection tool, a circle selection tool, a polyline selection tool, a freehand selection tool, a paintbrush selection tool, a flood fill selection tool, a box selection tool, a cylinder selection tool and/or a sphere selection tool.

30. The medium of claim 19 wherein the execution of the instructions further cause the computing device to:
edit the selected region; and
re-identify automatically a surface type to represent the region.

31. The medium of claim 30 wherein the editing of the selected region performs an operation selected from the group comprising adding to the selected region, removing at least a portion of the selected region, merging the selected region with another region, splitting the selected region, enlarging the region and shrinking the region.

32. The medium of claim 30 wherein the execution of the instructions further cause the computing device to:
calculate programmatically surface parameters for the selected region based on the re-identified type.

33. A physical medium holding computer-executable instructions for performing 3D CAD part body modeling using 3D scan data, the instructions when executed causing a computing device to:
provide a collection of 3D scan data representing the shape of a three dimensional object that cumulatively forms a model of the three dimensional object;
receive a selection of the 3D scan data representing at least one region in the model;
calculate with the computing device an implied surface for the at least one region using the selected data;
use the implied surface as an input argument to a CAD part body modeling operation;
perform the CAD part body modeling operation using the implied surface body;
receive a selection of the modifying of the 3D scan data, the modifying altering the 3D scan data geometrically or topologically;
automatically modify the implied surface body based on the modifying of the 3D scan data; and
perform the CAD part body modeling operation using the modified implied surface body as an input argument.

* * * * *